United States Patent [19]
Seshadri et al.

[11] Patent Number: 5,289,501
[45] Date of Patent: Feb. 22, 1994

[54] CODED MODULATION WITH UNEQUAL ERROR PROTECTION FOR FADING CHANNELS

[75] Inventors: Nambirajan Seshadri; Carl-Erik W. Sundberg, both of Chatham, N.J.

[73] Assignee: AT&T Bell Laboratories, Murray Hill, N.J.

[21] Appl. No.: 797,831

[22] Filed: Nov. 26, 1991

[51] Int. Cl.$^5$ ............................................. H04L 25/49
[52] U.S. Cl. ........................................ 375/17; 375/34; 375/39; 375/60; 371/37.1; 371/43
[58] Field of Search ...................... 375/17, 34, 39, 38, 375/60; 371/37.1, 37.7, 43, 37.8; 341/94

[56] References Cited

U.S. PATENT DOCUMENTS

| | | | |
|---|---|---|---|
| 4,882,733 | 11/1989 | Tanner | 371/43 |
| 5,105,442 | 4/1992 | Wei | 375/39 |
| 5,164,963 | 11/1992 | Lawrence et al. | 375/39 |

FOREIGN PATENT DOCUMENTS

| | | | |
|---|---|---|---|
| 485105 | 10/1991 | European Pat. Off. | H04L 27/34 |
| 485108 | 10/1991 | European Pat. Off. | H04L 27/34 |

OTHER PUBLICATIONS

W. F. Schreiber, "Spread-Spectrum Television Broadcasting", *SMPTE Jrn.*, Aug. 1992, pp. 538–549.
K. M. Uz et al., "Multiresolution Source & Channel Coding . . . ", *Signal Processing of HDTV, III*, 1992 Elsevier Science Publisher pp. 61–69.
M. Vetterli et al. "Multiresolution Coding Techniques for Digital TV", *Multidimensional Systems & Signal Processing*, 1992, Kluwer Academic Publishers, Boston, pp. 53–79.
K. M. Uz et al., "Combined Multiresolution Source Coding & Modulation . . . ", *Signal Processing, 1992*, Elsevier Science Pubs. pp. 283–290.

*Primary Examiner*—Curtis Kuntz
*Assistant Examiner*—Don N. Vo
*Attorney, Agent, or Firm*—Gerard A. deBlasi

[57] ABSTRACT

Information is transmitted in digital form over fading channels using DPSK coded modulation incorporating multi-level coding in order to provide unequal error protection for different classes of data such as generated by CELP or other speech encoders.

31 Claims, 5 Drawing Sheets

CODED MODULATION WITH UNEQUAL ERROR PROTECTION FOR FADING CHANNELS

BACKGROUND OF THE INVENTION

The present invention relates to the transmission of information in digital form over fading channels.

The increasing prominence of wireless telecommunications—particularly in the realm of digital cellular mobile radio—has given rise to the demand for improvements in the bandwidth efficiency of such systems. To this end, efficient coded modulation schemes, such as the built-in time-diversity technique disclosed in U.S. Pat. No. 5,029,185, issued to L. F. Wei on Jul. 2, 1991 and entitled "Coded Modulation for Mobile Radio," have been developed. Increased bandwidth efficiency is also achieved in these systems via the use of low-bit-rate speech coders, such as the so-called code-excited linear predictive (CELP) coders, which operate in the range of about 4 to 8 kilobits per second (kbps).

The low-bit-rate coders represent speech information in such a way that certain aspects of the coded information is of significantly greater importance than other aspects in terms of being able to recover intelligible speech at the receiver. In CELP coders, for example, that so-called "important information" may comprise a) the linear predictive coding (LPC) parameters, b) the pitch, and c) a bit of information which indicates whether the speech was voiced or unvoiced. It is thus desirable that the transmission scheme be able to communicate the "important information" with a high degree of reliability, even at the expense—if channel conditions make it necessary—of the other, "less important" information. Such transmission schemes are referred to herein generically as schemes which provide "unequal error protection." And it should also be noted at this point that, in general, there can be any desired number of classes of information, of varying importance, rather than being limited to, for example, two classes.

Transmission schemes which provide unequal error protection are, in fact, known in the prior art. Such known technology is exemplified by, for example, in Carl-Erik Sundberg, "Optimum Weighted PCM for Speech Signals," *IEEE Transactions on Communications*, Vol. COM-26, No. 6, June 1978, pp. 872–881; C.-E. W. Sundberg et al., "Logarithmic PCM weighted QAM transmission over Gaussian and Rayleigh fading channels," *IEE Proceedings*, Vol. 134, Pt. F, No. 6, October 1987, pp. 557–570; and in the commonly assigned co-pending patent applications of V. B. Lawrence et al., Ser. No. 07/611,225 filed Nov. 7, 1990 (now U.S. Pat. No. 5,164,963, issued Nov. 17, 1992) and entitled "Coding for Digital Transmission," and of L. F. Wei, Ser. No. 07/611,200 filed Nov. 7, 1990 (now U.S. Pat. No. 5,105,442, issued Apr. 14, 1992) and entitled "Coded Modulation with Unequal Error Protection." Wireless telecommunications of the type that the present invention is concerned with are typically carried out over so-called fading channels, by which is meant so-called Rayleigh or near-Rayleigh channels, where multiplicative Rayleigh noise is the predominant noise phenomenon. However, the prior art (for coded modulation) has generally addressed the unequal error protection problem in the context of transmission of the information over, for example, voiceband telephone channels and HDTV channels, where additive white Gaussian noise is the predominant noise phenomenon, and those schemes will not perform effectively if used for the fading environment. Moreover, although aforementioned coded modulation schemes as disclosed in the Wei patent application are, in fact, directed to fading channel applications, they provide equal error protection for the transmitted data rather than the unequal error protection that is so highly desirable for the aforementioned coded speech applications. It can also be noted that schemes which provide unequal error protection in conjunction with binary and quaternary phase shift keyed signals are known in the prior art. See "Rate-compatible punctured convolutional codes for digital mobile radio," by J. Hagenauer, N. Seshadri and C.-E. W. Sundberg in *IEEE Transactions on Communications*, Vol. 37, No. 7, July 1990. However, these schemes are limited to a maximum of two bits per symbol, irrespective of the signal-to-noise ratio (SNR) of the channel and are thus bandwidth-inefficient. Moreover, even when achieving two bits per symbol, these schemes are power-inefficient.

There thus remains in the art the need for effective, bandwidth- and power-efficient transmission schemes which can provide unequal error protection in fading channel environments.

SUMMARY OF THE INVENTION

The present invention meets that need. In particular, in accordance with the principles of the invention, the information is coded using a multi-level channel code, by which is meant that a) each class of information is redundancy coded using a different, respective channel code and that b) the resulting multi-level-coded words select for transmission signal points of a predetermined signal constellation. In preferred embodiments, the minimum Hamming distance (defined below) for the code used for any particular class of information is greater than the minimum Hamming distance for the code used for any less important class of information. The error probability for channels characterized by Rayleigh fading assuming adequate interleaving (as described below), and coherent or differential coherent detection, at high SNR is, to a first, and typically adequate, approximation, proportional to the reciprocal of the signal-to-noise ratio (SNR) raised to the power of the minimum Hamming distance (assuming the use of, for example, a maximum likelihood decoding strategy). That is, for the $i^{th}$ class of data, class i, $$P_e(i) \approx \gamma_i [1/\text{SNR}]^{d_{Hi}},$$

where $d_{Hi}$ is the minimum Hamming distance, $\gamma_i$ is a proportionality constant and $P_e(i)$ is the probability of error upon decoding. Different levels of error protection are thus provided for the different classes of data.

As is explained in detail hereinbelow, the proportionality constant $\gamma_i$ depends primarily on the ratio of a) the average number of nearest neighbors for the $i^{th}$ class of data to b) the product distance for that class. These parameters are determined by a) the channel codes and b) the signal constellation design, the latter including, for example, the constellation geometry, the labelling of the signal points and the manner in which the outputs of the channel codes map into the labels. Thus, in accordance with a feature of the invention, attainment of particular desired error probabilities for the various different data classes can be facilitated by appropriate joint selection of channel codes and signal constellation design.

The prior art does disclose the use of multi-level codes in a fading channel environment, but only in the context of providing equal error protection. Exemplary is N. Seshadri and C.-E. W. Sundberg, "Multi-level codes with large time-diversity for the Rayleigh fading channel," *Conference on Information Sciences and Systems*, Princeton, N.J., pp. 853-857, March 1990. Additionally, co-pending, commonly assigned U.S. patent application Ser. No. 07/785,723 filed Oct. 31, 1991 discloses the use of multi-level codes to provide unequal error protection, but not in the context of fading channels.

DETAILED DESCRIPTION

Before proceeding with a description of the illustrative embodiments, it should be noted that various of the digital signaling concepts described herein are all well known in, for example, the digital radio and voiceband data transmission (modem) arts and thus need not be described in detail herein. These include such concepts as multidimensional signaling using 2N-dimensional channel symbol constellations, where N is some integer, trellis coding; scrambling; passband shaping; equalization; Viterbi, or maximum-likelihood, decoding; etc. These concepts are described in such U.S. patents as U.S. Pat. No. 3,810,021, issued May 7, 1974 to I. Kalet et al; U.S. Pat. No. 4,015,222, issued Mar. 29, 1977 to J. Werner; U.S. Pat. No. 4,170,764, issued Oct. 9, 1979 to J. Salz et al; U.S. Pat. No. 4,247,940, issued Jan. 27, 1981 to K. H. Mueller et al; U.S. Pat. No. 4,304,962, issued Dec. 8, 1981 to R. D. Fracassi et al; U.S. Pat. No. 4,457,004, issued Jun. 26, 1984 to A. Gersho et al; U.S. Pat. No. 4,489,418, issued Dec. 18, 1984 to J. E. Mazo; U.S. Pat. No. 4,520,490, issued May 28, 1985 to L. Wei; and U.S. Pat. No. 4,597,090, issued Jun. 24, 1986 to G. D. Forney, Jr.—all of which are hereby incorporated by reference.

It may also be noted before proceeding that various signal leads shown in the FIGS. may carry analog signals, serial bits or parallel bits, as will be clear from the context.

Figure 1:
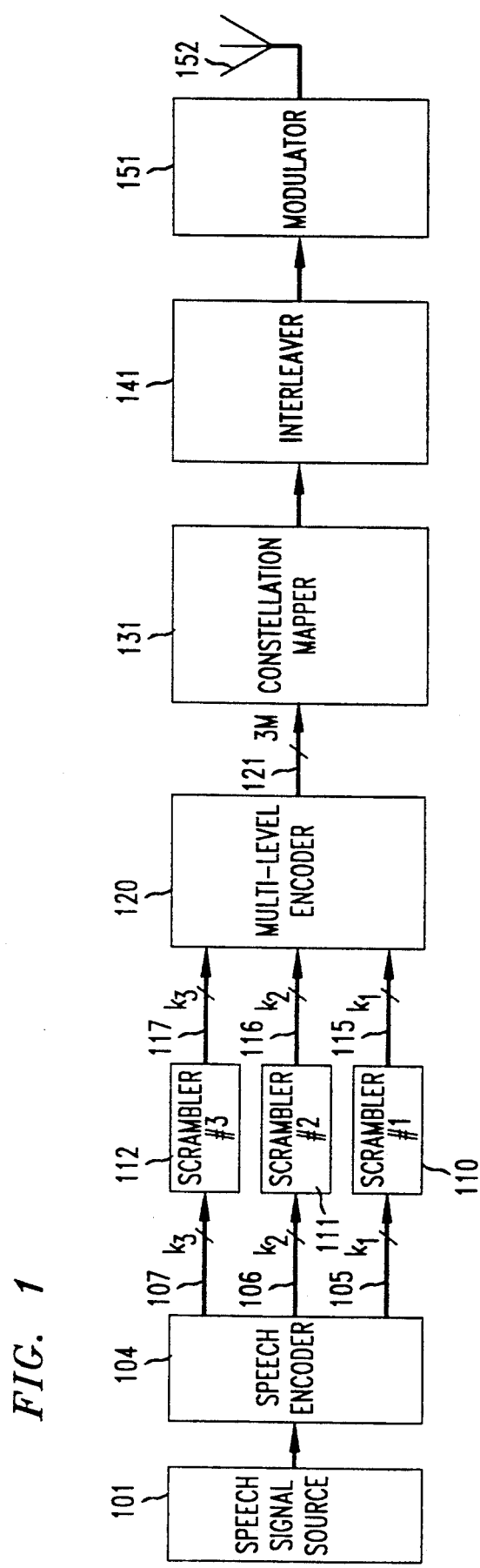
FIG. 1 is a block diagram of a transmitter embodying the principles of the invention.

Turning now to FIG. 1, which illustratively depicts a digital cellular mobile radio terminal such as might be installed in an automobile, speech signal source 101 generates an analog speech signal representing speech information or "intelligence," which is passed on to speech encoder 104, illustratively a CELP coder of the type described above. The latter generates a digital signal comprised of a stream of data, or data elements, in which at least one subset of the data elements represents a portion of the information, or intelligence, that is more important than the portion of the information, or intelligence, represented by the rest of the data elements. Illustratively, each data element is a data bit, with an average $K = k_1 + k_2 + k_3$ information bits being generated for each of a succession of M symbol intervals. The symbol intervals are comprised of N signaling intervals, where 2N is the number of dimensions of the constellation (as described below). The signaling intervals have duration of T seconds and, accordingly, the symbol intervals each have a duration of NT seconds. The embodiments explicitly disclosed herein happen to use two-dimensional constellations, i.e., N=1. For those embodiments, then, the signaling intervals and symbol intervals are the same.

Of the aforementioned K information bits, the bits within the stream of $k_1$ bits per M symbol intervals, appearing on lead 105, are more important than the $k_2$ bits per M symbol intervals, appearing on lead 106, and in turn these bits are more important than the $k_3$ bits per M symbol intervals appearing on lead 107. The bits on these three leads are referred to herein as the class 1, and class 2 and class 3 bits, respectively.

The bits on leads 105-107 are independently scrambled in scramblers 110-112, which respectively output on leads 115-117 the same number of bits per M symbol intervals as appear on leads 105-107, respectively. (In particular specific embodiments, scrambling may not be required.) Scrambling is customarily carried out on a serial bit stream. Thus although not explicitly shown in FIG. 1, scramblers 110-112 may be assumed to perform a parallel-to-serial conversion on their respective input bits prior to scrambling and a serial-to-parallel conversion at their outputs. The signal is then channel encoded and mapped. In particular, the bits on leads 115-117 are extended to multi-level coder 120. As described in detail hereinbelow, the latter illustratively includes three channel encoders which respectively receive the bits on leads 115-117. These encoders generate, for each block of M symbol intervals, a block of M multibit (illustratively 3-bit), multi-level-coded, words. M is greater than $(k_1 + k_2 + k_3)/3$ so that the multi-level encoder is a redundancy coder, i.e., more bits are output than are input. The multi-level code implemented by encoder 120 to generate the multi-level-coded words lead 121 has so-called built-in time-diversity. Those bits comprise a multi-level-coded word and their values jointly select, or identify, a particular channel symbol of a predetermined constellation of channel symbols (such as the constellation of FIG. 5 as described in detail hereinbelow). Complex plane coordinates of the identified channel symbols are output by constellation mapper 131, illustratively realized as a lookup table or as a straightforward combination of logic elements. The complex channel symbols are interleaved in standard fashion by an interleaver 141 in order to be able to take advantage of the built-in time-diversity of the multi-level code. Since such interleaving is standard, it suffices for present purposes simply to note that the function of the interleaver is to provide adequate time-separation between signal points which comprise a coded block to ensure that fading events associated with those signal points are, in general, independent. The output of interleaver 141 is applied to modulator 151 and the resultant analog signal is then broadcast via antenna 152 over a free space communication channel to a remote digital cellular mobile radio cell site.

Figure 3:
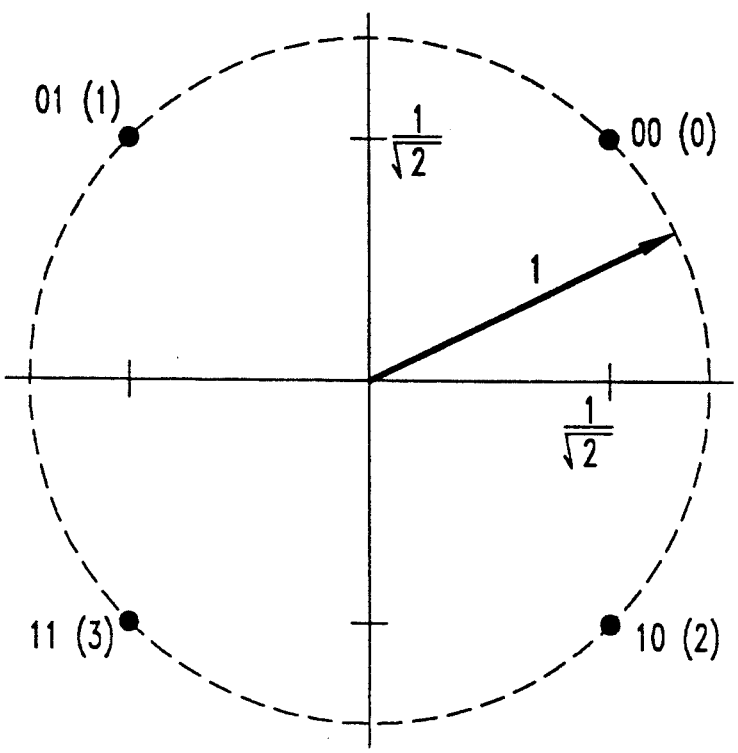
FIG. 3 depicts a signal constellation useful in explaining the principles of the invention.

In order to understand the theoretical underpinnings of the invention, it will be useful at this point to digress to a consideration of FIG. 3. The latter depicts a standard two-dimensional data transmission constellation of the general type conventionally used in digital cellular mobile radio. In this standard scheme—conventionally referred to as differential phase shift keyed (DPSK) modulation—data words each comprised of two information bits are each mapped into one of four possible two-dimensional channel symbols. The phase angle of each signal point (measured from the positive X axis) indicates a change that the phase of the transmitted signal must undergo in order to transmit the bit pattern associated with that particular signal point. More particularly, so-called $\pi/4$-shifted DPSK, in which the entire constellation is rotated by 45 degrees in successive signaling intervals, can be used. (Non-differential (coherent) PSK, where each signal point represents the associated bit pattern directly, could alternatively be used in appropriate applications.) Each channel symbol has an in-phase, or I, coordinate on the horizontal axis and has a quadrature-phase, or Q, coordinate on the vertical axis. The signal points have equal amplitude—lying on a circle of radius 1—so that, on each axis, the channel symbol coordinates are $$\pm \frac{1}{\sqrt{2}}.$$

Thus the distance between each symbol and each of the symbols that are nearest to it is the same for all symbols—that distance being $\sqrt{2}$. As a result of this uniform spacing, essentially the same amount of noise immunity is provided for both information bits.

We now define some useful terminology: "Hamming distance," "minimum Hamming distance," "number of nearest neighbors," and "product distance." In particular, the "Hamming distance" between any two distinct sequences of signal points selected from the constellation is the number of positions within the two sequences at which the signal points differ. The "minimum Hamming distance" is the minimum over all such Hamming distances, i.e., taking into account all possible pairs of sequences. Since we are assuming at this point an uncoded transmission scheme, all possible sequences of signal points are allowed. This being so, the minimum Hamming distance for an uncoded transmission scheme is "1". A code which has so-called built-in time-diversity has a minimum Hamming distance which is greater than "1", the measure of that time-diversity being, in fact, the minimum Hamming distance. The "product distance" is the product of all non-zero squared Euclidean distances between the corresponding signal points of the sequences that are at minimum Hamming distance from each other—known as the "nearest neighbor sequences." For the present case, the product distance is "2". The "number of nearest neighbors" is the average number of sequences that are at the minimum Hamming distance to any transmitted sequence with a product distance of 2 and, in this case, the "number of nearest neighbors" is "2".

As is well known, it is possible to provide improved noise immunity without sacrificing bandwidth efficiency (information bits per signaling interval) using a coded modulation approach in which an "expanded" two-dimensional constellation having more than (in this example) four symbols is used in conjunction with a trellis or other channel code. For example, the above-cited U.S. Pat. No. 5,029,185 discloses the use of expanded PSK constellations in combination with trellis and block codes to provide enhanced noise immunity of more than 10 dB over the uncoded case of FIG. 3 while providing approximately two bits per signaling interval.

In the above-cited '185 patent as, indeed, in the case of FIG. 3 hereof, the same amount of noise immunity is provided for all information bits. Thus, as noted above, there remains in the art the need for effective, bandwidth- and power-efficient transmission schemes which can provide unequal error protection in fading channel environments—a need that is met by the present invention.

In particular, in accordance with the principles of the invention, the information is coded using a multi-level channel code, by which is meant that a) each class of information is channel coded using a different, respective channel code and that b) the resulting coded outputs select for transmission signal points of a predetermined signal constellation.

Figure 4:
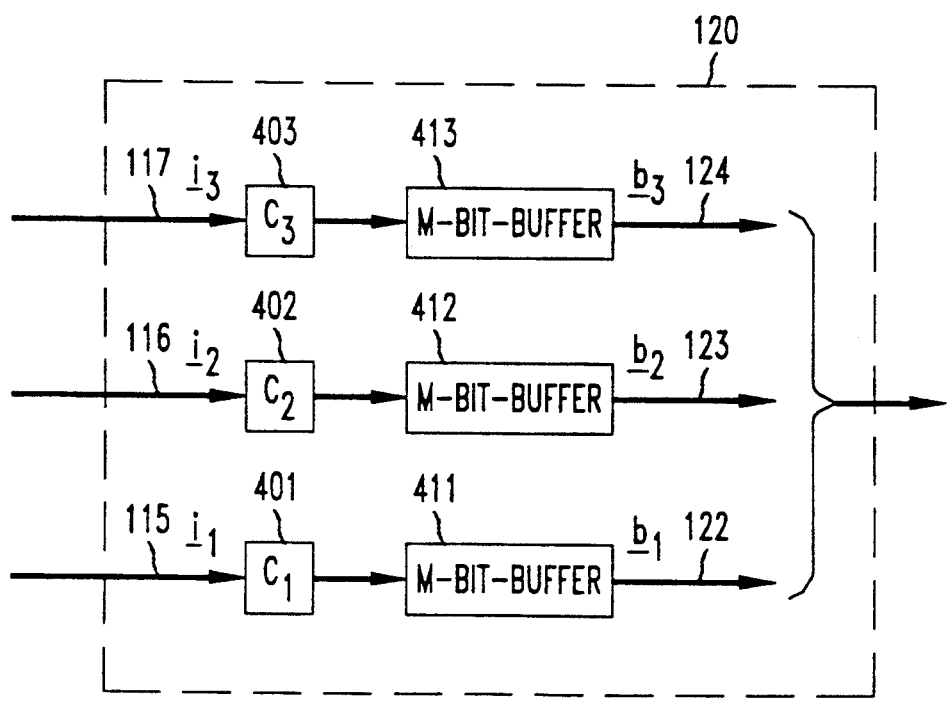
FIG. 4 is a block diagram of a multi-level encoder used in the transmitter of FIG. 1.

To this end, and referring to FIG. 4, there is shown an illustrative embodiment of multi-level—illustratively three-level—channel coder 120. As noted earlier, the three classes of data are received on leads 115-117, from most-to least-important. The bit streams for these three classes are denoted $i_1$, $i_2$ and $i_3$ and are applied to respective channel encoders $40i$, $i = 1, 2, 3$, i.e., encoders 401, 402 and 403, which respectively implement redundancy codes $C_i$, $i = 1, 2, 3$, i.e., codes $C_1$, $C_2$ and $C_3$. The output bit streams from the three channel encoders—which are buffered in buffers 411, 412 and 413, as described below—are denoted $\underline{b}_1$, $\underline{b}_2$ and $\underline{b}_3$ and appear on leads 122-124, respectively. The constituent elements of the output bit streams can be represented as follows, in which the superscripts denote time:

$$\underline{b}_3 = (b_3^1, b_3^2, \ldots, b_3^M)$$

$$\underline{b}_2 = (b_2^1, b_2^2, \ldots, b_2^M)$$

and $\underline{b}_1 = (b_1^1, b_1^2, \ldots, b_1^M)$.

The multi-level encoder output is $$\underline{b} = (b^1, b^2, \ldots, b^M)$$

where $$b^j = 4b_3^j + 2b_2^j + b_1^j.$$

Figure 5:
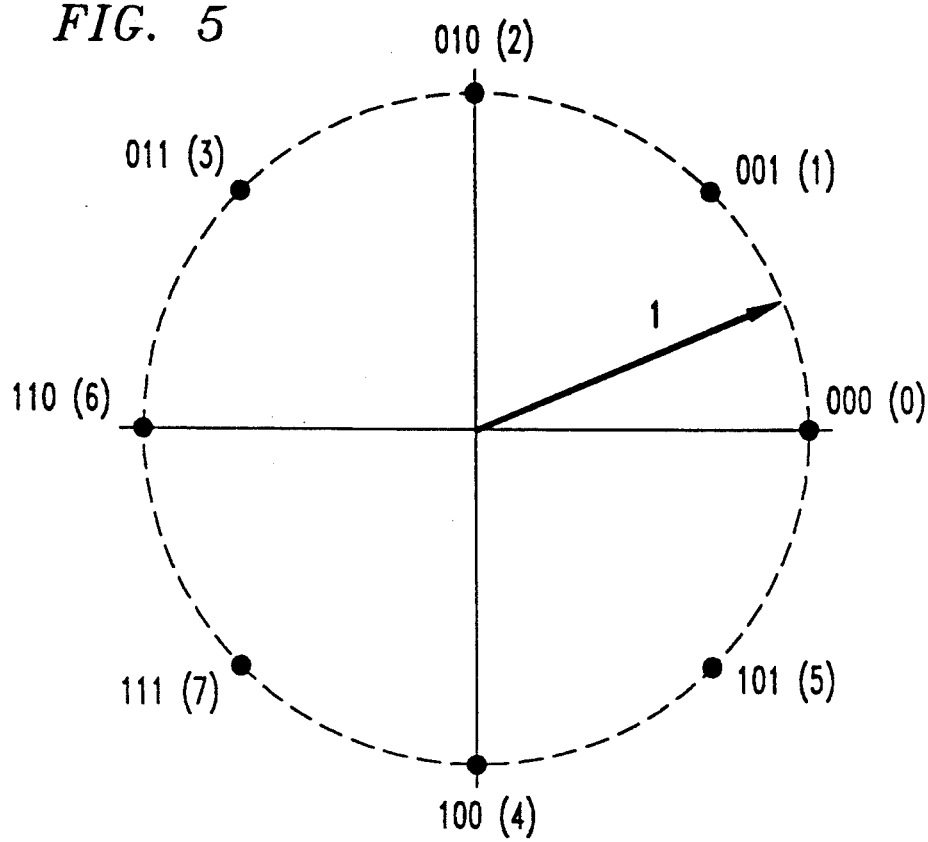
FIGS. 5-7 depict signal constellations that can illustratively be used by the transmitter of FIG. 1.

The index $b^j$ then constitutes an address applied to constellation mapper 131 to select a particular signal point of an illustrative 8-PSK constellation which is shown in FIG. 5. Note, in particular, that each of the eight signal points of the constellation has an associated label—shown in both binary and, in parentheses, decimal form—which is used as the address. Various ways of assigning the signal point labels to achieve certain overall error probabilities for particular codes and particular constellations are discussed hereinbelow.

The codes respectively implemented by encoders $40i$, $i = 1, 2, 3$, are codes which are characterized by the parameter set (M, $k_i$ and $d_{Hi}$), $i = 1, 2, 3$. Here, M, introduced above, is the block length of the code; $k_i$, introduced above, is the number of information bits required to be applied to encoder $40i$ to generate the output block; and $d_{Hi}$ is the minimum Hamming distance (defined above) of code $C_i$. The three codes are illustratively as follows: Code $C_1$ is a (4,1,4) binary repetition code consisting of codewords 0000 and 1111; code $C_2$ is a (4,3,2) binary parity check code with even parity; and code $C_3$ is a (4,4,1) code, which means that, in this example, no redundancy is added. That is, class 3 is not coded at all. Since $M=4$, and since each signal point is a two-dimensional signal point, the overall coded modulation scheme is 8-dimensional (8D). The class 1 bits—which are the most important—are encoded by code $C_1$; the class 2 bits—which are the second-most important—are encoded by code $C_2$; the class 3 bits—which are the third-most important—are encoded by code $C_3$. In order to provide three-bit addresses to constellation mapper 131 on an ongoing, regular basis, buffers 411, 412 and 413, each of length $M=4$, are provided, as already noted, to buffer the outputs of encoders 401, 402 and 403. It is thus seen that $K=k_1+k_2+k_3=8$. That is, 8 information bits are transmitted for each block of $M=4$ symbol intervals, yielding a bit rate of 2 bits per signaling interval. Note that $\frac{1}{8}=12.5\%$ of the data is in class 1; $\frac{3}{8}=37.5\%$ of the data is in class 2; and $4/8=50.0\%$ of the data is in class 3.

In order to advantageously use the minimum Hamming distance separation, i.e., the built-in time-diversity of a code, it is necessary that symbols within any one block of M signal points be subject to independent fading. In practice this is achieved by way of the interleaving provided by interleaver 141 as described above.

We consider, now, specifically the error probability for each of the data classes in this example. We first note that the typical cellular mobile radio channel is a Rayleigh fading channel. The probability of error for such channels is, to a first, and typically adequate, approximation, proportional to the reciprocal of the signal-to-noise ratio (SNR) raised to the power of the minimum Hamming distance (assuming the use of, for example, a maximum likelihood decoding strategy). That is, for the $i^{th}$ class of data $$P_e(i) \approx \gamma_i \left( \frac{1}{SNR} \right)^{d_{Hi}},$$

where $d_{Hi}$ is the minimum Hamming distance
$P_e(i)$ is the probability of error upon decoding and
$\gamma_i$ is a proportionality constant.

(Hereinafter, for convenience, we will use "$P_e(i)=$" rather than "$P_e(i)\approx$".) Therefore, since the minimum Hamming distance for class 1 is "4," which is greater than that for any less important class of data for which the minimum Hamming distance is "2", the bit error probability for the former is, in accordance with the invention, better (i.e., lower) than that for the latter, assuming some minimum SNR and ignoring, in the first instance, the contributions of the proportionality constants $\gamma_i$.

Of course, it is readily seen that the proportionality constants $\gamma_i$ do also make a contribution to $P_e(i)$. Each $\gamma_i$, in particular, is proportional to is the ratio of a) the average number of nearest neighbors for the $i^{th}$ class of data to b) the so-called product distance for that class. (Hereinafter, for convenience, we will use "$\gamma_i=$" rather than "$\gamma_i\approx$".) These parameters are determined by codes chosen, as well as the signal constellation design, which includes, for example, the constellation geometry, the labelling of the signal points and the manner in which the outputs of the channel codes map into the labels. Thus, in accordance with a feature of the invention, attainment of particular desired error probabilities for the various different data classes can be facilitated by appropriate joint selection of channel codes and signal constellation design. In virtually all instances of practical interest, the code selection and constellation design will be such that the values of the $\gamma_i$ will not change the result that $P_e(1)<P_e(2)<P_e(3)$ . . . for $d_{H1}>d_{H2}>d_{H3}$ . . . .

The product distance for the class 1 data is $0.587^4=0.119$, which can be verified by noting that the minimum Hamming distance of code $C_1$ is "4" and that the squared Euclidean distance between nearest neighbors of the signal constellation which differ in the bit that is addressed by the output of code $C_1$—bit $b_1$—is 0.587. The number of nearest neighbors for this code is 8 since, corresponding to any transmitted multi-level-coded words, there are 8 other multi-level-coded words which are at a Hamming distance of 4 with a product distance of 0.119. Thus, $$\gamma_1=8/0.119=67.23.$$

For class 2 data, the product distance is $2^2=4$, which can be verified by noting the minimum Hamming distance of code $C_2$ is "2" and that the squared Euclidean distance between nearest neighbors of the signal constellation which differ in the bit that is addressed by the output of this code is 2.0. The number of nearest neighbors for this code is 6 since for each multi-level-coded word (assuming $i_1$ has been decoded correctly), there are 6 multi-level-coded words that are at a Hamming distance of 2 that can result in an error in information sequence $i_2$. Thus, $$\gamma_2=6/4=1.5.$$

For class 3 data, the product distance is 2.0, which can be verified by noting the minimum Hamming distance for an uncoded case—which is what code $C_3$ is in this example—is "1" since the squared Euclidean distance between nearest neighbors of the signal constellation which differ in the bit that is addressed by the output of this code is 2.0. The number of nearest neighbors for this code is "1" since there is only one neighbor at squared Euclidean distance "2.0" (assuming that the bits encoded by codes $C_2$ and $C_1$ have been decoded correctly). Thus, $$\gamma_3=\frac{1}{2}=0.5.$$

Overall, then, $$\gamma_1=8/0.119=67.2,$$

$$\gamma_2=6/4=1.5,$$

$$\gamma_3=1.0/2.0=0.5,$$

so that data classes 1, 2 and 3 have the following error probabilities:

$$P_e(1)=67.2[1/SNR]^4,$$

$$P_e(2)=1.5[1/SNR]^2,$$

$$P_e(3)=0.15[1/SNR]^1,$$

Note that as desired—at least when the SNR is greater than some minimum—the greatest level of error protection (lowest error probability) is provided to class 1; the second-greatest level of error protection is provided to class 2; and the third-greatest level of error protection is provided to class 3.

(In this example, as well as all the other examples given herein, it is assumed that the interleaver provides sufficient separation in time between the signal points within a block of M signal points to ensure that fading events associated with those signal points are, in general, independent.)

It will be immediately apparent, then, that using different codes—to provide different minimum Hamming distances—and different constellations—to provide different proportionality constants—various different sets of levels of protection can be provided. A few different possibilities—which are, of course, illustrative and not in any sense exhaustive—will now be presented. We begin by changing the codes while continuing to use the constellation and signal point labelling of FIG. 5.

Consider, for example, a 16-D block coded modulation scheme which uses the following set of codes:

$C_1$ is an (8,4,4) extended Hamming code;

$C_2$ is an (8,7,2) binary parity check code with even parity;

$C_3$ is an (8,7,2) binary parity check code with even parity.

It is thus seen that $K = k_1 + k_2 + k_3 = 18$. That is, 18 information bits are transmitted for each block of $M=8$ symbol intervals, yielding a bit rate of 2.25 bits per signaling interval. Note that $4/18 = 22.2\%$ of the data is in class 1; $7/18 = 39.9\%$ of the data is in class 2; and $7/18 = 39.9\%$ of the data is in class 3.

Overall, then, $\gamma_1 = 224/0.119 = 1882.35$, $\gamma_2 = 28/4.0 = 7.0$, $\gamma_3 = 28/4.0 = 7.0$, so that data classes 1, 2 and 3 have the following error probabilities:

$P_e(1) = 1882.35[1/SNR]^4$, $P_e(2) = 7[1/SNR]^2$, $P_e(3) = 7[1/SNR]^2$.

It will be readily seen that, in this case, the same level of error protection is provided to classes 2 and 3, yielding, in effect, a two-rather than a three-level unequal error protection scheme. However, as will be seen later, using a different constellation design—while not affecting the minimum Hamming distance—can result in a change of the proportionality constants, thereby providing different levels of error protection for classes 2 and 3.

Now we consider a 32-D block coded modulation scheme which uses the following set of codes:

$C_1$ is an (16,11,4) extended Hamming code;

$C_2$ is an (16,15,2) binary parity check code with even parity;

$C_3$ is an (16,15,2) binary parity check code with even parity.

It is thus seen that $K = k_1 + k_2 + k_3 = 41$. That is, 41 information bits are transmitted for each block of $M=16$ symbol intervals, yielding a bit rate of 2.56 bits per signaling interval. Note that $11/41 = 26.8\%$ of the data is in class 1; $15/41 = 36.6\%$ of the data is in class 2, and $15/41 = 36.6\%$ of the data is in class 3.

Overall, then, $\gamma_1 = 2240/0.119 = 18823.5$, $\gamma_2 = 120/4 = 30$, $\gamma_3 = 120/4 = 30$, so that data classes 1, 2 and 3 have the following error probabilities:

$P_e(1) = 18823.5[1/SNR]^4$, $P_e(2) = 30[1/SNR]^2$, $P_e(3) = 30[1/SNR]^2$.

Note that in this case, the error probabilities are approximately the same as in the previous example. However, the bits per symbol are different.

Now we consider a coded modulation scheme affording two, rather than three, levels of error protection and in which a binary convolutional code is used for protecting the class 1 data and a block code is used for protecting the class 2 data. The codes, in particular, are:

$C_1$ is a rate $R=\frac{1}{2}$ convolutional code;

$C_2$ is a (L, L-1,2) binary parity check code with even parity.

Code $C_1$, more particularly, is a maximum free distance ($d_{free}$) code for any memory of the code that is desirable and is of the type described, for example, in J. G. Proakis, *Digital Communications*, 2nd Ed., McGraw-Hill, 1989. The two bits output by code $C_1$ determine bits $b_1$ and $b_2$ and the output from code $C_2$ determines $b_3$. In this case, the total number of bits transmitted in a block of length L is $K = (2L-1)$, yielding a bit rate of $2-(1/L)$ bits per signaling interval. Approximately 50% of the bits are in each of the classes 1 and 2, for reasonably large L. For example, if code $C_1$ is a memory 2 convolutional code, and $L=10$, then $\gamma_1 = 1/2.25 = 0.44$, $\gamma_2 = 45/16 = 2.81$.

Moreover, as is well known, the parameter for convolutional codes which corresponds to the role of the minimum Hamming distance for block codes is, in this case, $(d_{free}-2) = 3$. In general, an upper bound on the value of time diversity for convolutional codes used in the manner described here is $d_{free}-2$. For memory 2 code, this upper bound is achieved. Overall, then, data classes 1 and 2 have the following error probabilities:

$P_e(1) = 1.0/2.25[1/SNR]^3$.

$P_e(2) = 45/16[1/SNR]^2$.

(For this example, in order to achieve the above error probabilities, and, in particular, the product distances indicated, the labeling assignment shown in FIG. 5 should be changed. The 000 label is assigned to the same signal point of the constellation. The other labels, reading counter-clockwise, are then, for this case, 001, 011, 010, 100, 101, 111 and 110.)

The foregoing examples thus illustrate that by using codes having various a) minimum Hamming distances (or convolutional code free distance) and b) block code lengths, one can obtain various levels of error protection, overall bits per signaling interval, and/or the fraction of bits allocated to the various classes. As noted earlier, yet further flexibility is provided by using various different constellations, thereby changing the proportionality constants $\gamma_i$.

Figure 6:
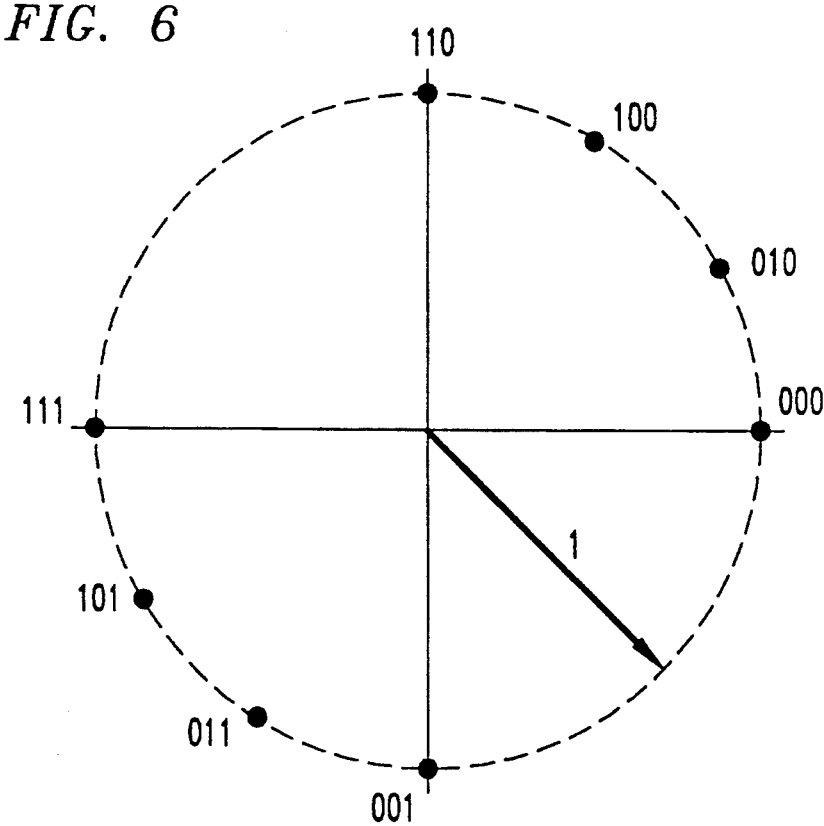
Figure 7:
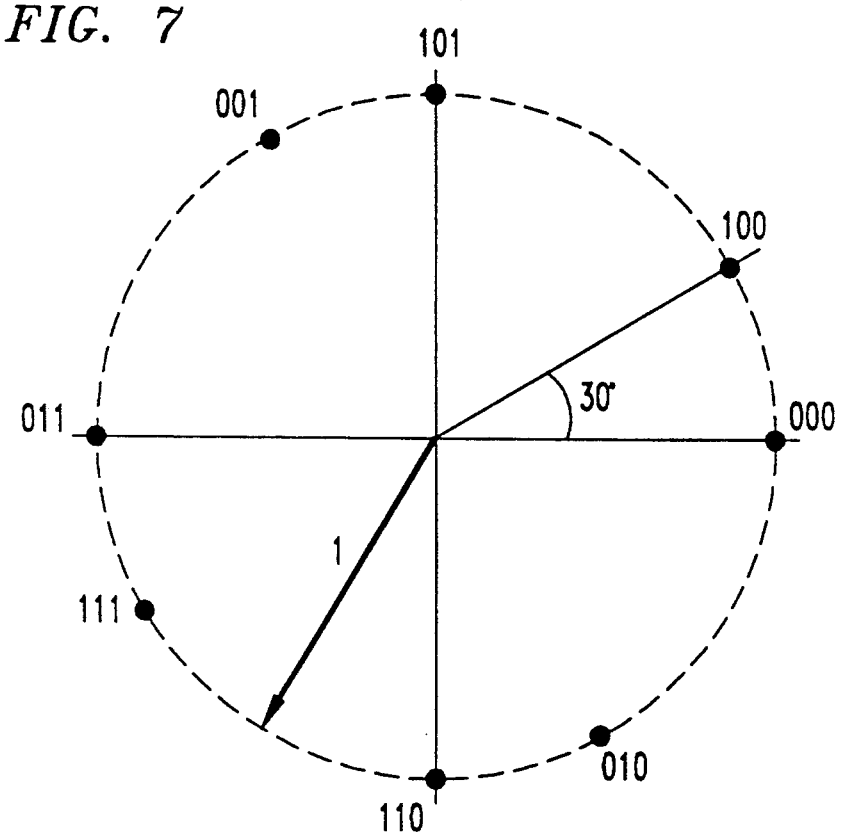

FIGS. 6 and 7 show respective 8-point PSK constellations in which the signal points are non-uniformly spaced and for which, as a result one can provide a) numbers of nearest neighbors and/or b) product distances that are different from those obtained for the constellation of FIG. 5. In this way, different proportionality constants $\gamma_i$ can, advantageously, be obtained.

Consider the use of these constellations in conjunction with the first set of codes described above for the 8-dimensional block code.

In the constellation of FIG. 6, in particular, the squared minimum Euclidean distance between any two signal points that differ in bit $b_1$—that is the bit that is output by encoder 401—is 2.0. Hence using this constellation in place of the constellation of FIG. 5 increases the product distance from 0.119 to 16 for class 1. However, the product distance for class 2 decrease from 4 to 0.43, while the product distance for class 3 decrease from 2.0 to 1.0. The number of nearest neighbors for class 1 decreases from 8 to 1, while for classes 2 and 3 it remains the same as it was, at 6 and 1, respectively. The proportionality constants thus have the values $\gamma_1 = 1/16 = 0.0625,$ $\gamma_2 = 6/0.43 = 13.95,$ $\gamma_3 = 1.0/0.43 = 2.33,$ Note, then, that the overall result is to provide even greater error protection (lower error probability) for class 1 at the expense of less error protection for classes 2 and 3. Thus, the minimum SNR at which class 1 data bits are subject to a better error probability is strictly lower with the constellation of FIG. 6 than with that of FIG. 5.

In the constellation of FIG. 7, in particular, the squared minimum Euclidean distance between any two signal points that differ in either of bits $b_1$ or $b_2$—that is the bits that are output by encoders 401 and 402—is 1.0. Hence using this constellation in place of the constellation of FIG. 5 increases the product distance from 0.119 to 1.0 for class 1. However, the product distance for class 2 decreases from 4.0 to 1.0, while the product distance for class 3 decreases from 4 to 0.43. The number of nearest neighbors for class 1 decreases from 8 to 1; for class 2, it remains at 6; and for class 3, it remains the same as it was at 1. The proportionality constants thus have the values $\gamma_1 = 1/1 = 1,$ $\gamma_2 = 6/1 = 6,$ $\gamma_3 = 1/0.43 = 2.32.$ Here, the overall result is to provide a greater separation, in terms of level of error protection between classes 2 and 3 than with either of the other two constellations. Class 1 still has more protection than when the constellation of FIG. 5 is used, but not as much as when the constellation of FIG. 6 is used.

It may also be possible to use codes which have the same minimum Hamming distance, in which case unequal error protection can nonetheless be obtained by having different values of $\gamma_i$ via, for example, the use of non-uniform signal constellations such as those of FIGS. 6 and 7.

Figure 2:
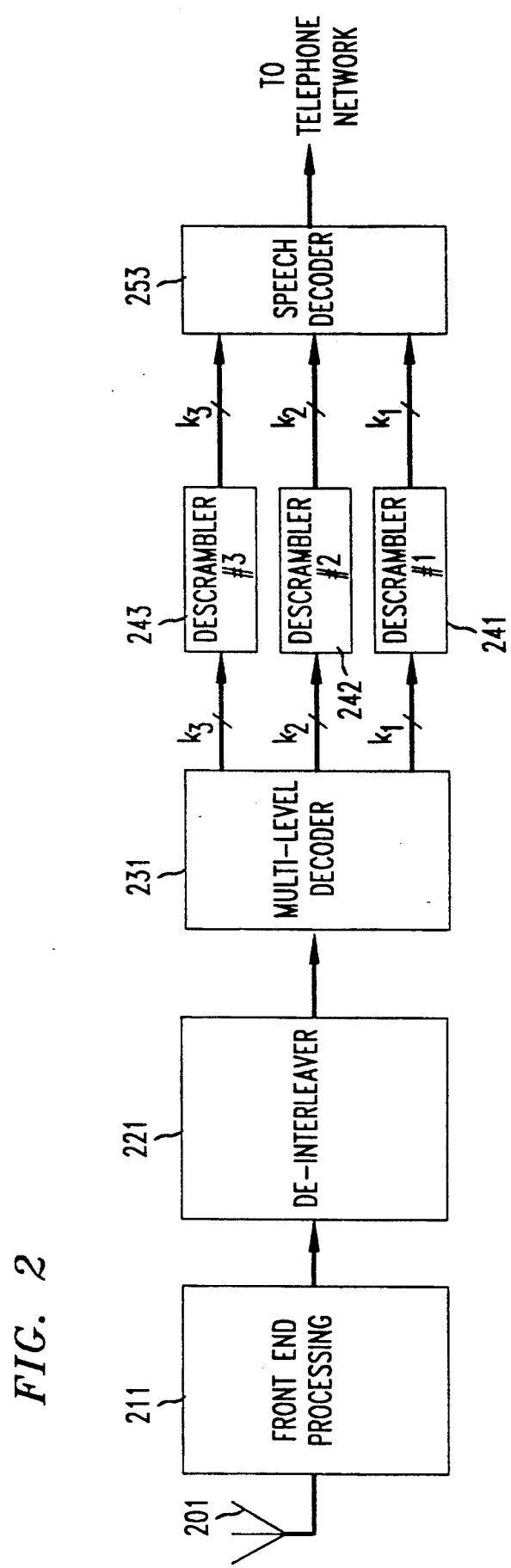
FIG. 2 is a block diagram of a receiver for signals transmitted by the transmitter of FIG. 1.

We turn, now, to the receiver of FIG. 2.

In particular, the analog cellular mobile radio signal broadcast from antenna 152 is received by antenna 201 and is thereupon subjected to conventional front-end processing, which includes at a minimum, demodulation and A/D conversion. Demodulation can be carried out by any of the known techniques, such as coherent demodulation, differentially coherent demodulation, non-coherent demodulation, etc. The front-end processing may also include such other processing as equalization, timing recovery, automatic gain control, etc., as is well known in the art. The output of front-end processing 211 is applied to de-interleaver 221, which performs the inverse task of interleaver 141 in the transmitter, thereby restoring the signal points to their original order. The de-interleaver output is passed on to multi-level decoder 231, which performs the task of recovering the information bits that were encoded by multi-level encoder 120. In the general case, a maximum-likelihood decoding algorithm is used. In particular, if the multi-level code is sufficiently simple, an exhaustive table-lookup approach can be used. For more complex codes, then the Viterbi algorithm could be used if the constituent codes of the multi-level code allow for a finite-state decoder realization. If the number of states of the multi-level code is too great to permit a practical implementation of a maximum-likelihood decoder, then multi-stage decoding can be used, this approach being described, for example, in A. R. Calderbank, "Multi-level codes and multi-stage decoding," *IEEE Transactions on Communications*, Vol. 37, pp. 222-229, March 1989. Enhanced multi-stage decoding as described in N. Seshadri and C.-E. W. Sundberg, "Multi-level codes with large time-diversity for the Rayleigh fading channel," *Conference on Information Sciences and Systems*, Princeton, N.J., pp. 853-857, March 1990, can also be used. More specifically in that case, if any of the constituent codes are complex, e.g. Reed-Solomon, block codes, then any of the known decoding techniques that approximate the performance of the maximum-likelihood decoder for such a code can be used to deal with that code within the multi-stage decoder.

The bits output by multi-level decoder 231 are provided in three parallel streams—corresponding to the three streams on leads 115-117—to respective descramblers 241-243, which perform the inverse function to scramblers 110-112 in the transmitter. Speech decoder 253 then performs the inverse function of speech encoder 104 of the transmitter, yielding a reconstructed speech signal that is passed on to the telephone network, including, typically, a cellular mobile radio switching system with which the receiver is co-located.

A transmitter and a receiver similar to those of FIGS. 1 and 2 would, of course, be provided at the cell site and mobile (automobile) site, respectively, to support communication in the other direction of transmission.

The foregoing merely illustrates the principles of the invention. For example, the various codes and constellations, including their dimensionalities are all illustrative. Any desired codes and constellations can be used. With respect to the codes, in particular, it should be noted that a data stream which is not actually redundancy coded, as is the case for code $C_3$ the first example hereinabove, may nonetheless be said to be coded with a rate $R=1$ redundancy code. That is, "no coding" can be regarded—and, for definitional purposes herein, is regarded—as being a form of coding. With the respect to the constellations, in particular, any of various uniform or non-uniform configurations which have any desired number of signal points may be used advantageously to provide different proportionality constants.

Moreover, any desired number of levels of error protection can be supported by using multiple multi-level codes to encode respective sets of data streams and time-multiplexing the signal points addressed by the various multi-level codes.

The invention can be used to advantage in conjunction with any type of source coder (such as image, facsimile) that needs unequal error protection—not just speech coders.

It will also be appreciated that although the various functional elements of the transmitter and receiver are depicted as discrete elements, the functions of those elements will typically be carried out using appropriately programmed processors, digital signal processing (DSP) chips, etc.

Thus it will be appreciated that those skilled in the art will be able to devise numerous arrangements which, although not explicitly shown or described herein, embodying the principles of the invention and thus are within its spirit and scope.

We claim:

1. Transmitter apparatus comprising,
   means for encoding first and second portions of a stream of input data using first and second redundancy codes, respectively, to generate multi-level-coded words each of which has a value and includes at least one data element from each encoded portion, said first code having a minimum Hamming distance that is greater than a minimum Hamming distance of said second code,
   means for selecting signal points of a predetermined signal constellation as a function of the values of said multi-level-coded words, and
   means for transmitting a signal representing the selected signal points over a fading communication channel,
   said constellation and codes being such that, in the transmission of said signal, a probability of error for said first portion is less than a probability of error for said second portion.

2. The transmitter apparatus of claim 1 wherein said stream of input data represents information and wherein said first and second portions of said stream of input data respectively represent more and less important aspects of said information.

3. The transmitter apparatus of claim 1 wherein the signal points of said constellation are of equal amplitude.

4. The invention of claim 3 wherein said signal points are non-uniformly spaced in phase.

5. The transmitter apparatus of claim 1 wherein said constellation and said selecting means are such as to modulate said multi-level-coded words using differential phase shift keying.

6. The transmitter apparatus of claim 1 wherein said first code has a degree of built-in time-diversity which is greater than a degree of built-in time-diversity of said second code.

7. Transmitter apparatus for communicating a plurality of streams of data over a channel characterized by Rayleigh fading, said apparatus comprising
   means for encoding said plurality of streams using respective associated redundancy codes to generate multi-level-coded words, each of which having a value,
   means for selecting signal points of a predetermined signal constellation as a function of the values of said multi-level-coded words, and
   means for transmitting a signal representing the selected signal points over said communication channel, said channel being such that, for an $i^{th}$ one of said streams, $$P_e(i) \approx \gamma_i [1/SNR]^{d_{Hi}},$$

where
SNR is a signal-to-noise ratio of said channel,
$d_{Hi}$ is a minimum Hamming distance for the code which encodes said $i^{th}$ stream of data,
$P_e(i)$ is a probability of error, upon decoding, for said $i^{th}$ stream of data, and
$\gamma_i$ is a proportionality constant for said $i^{th}$ stream of data which is a function of said codes and said constellation,
said codes and said constellation being chosen such that the value of $P_e(i)$ decreases for decreasing values of i.

8. The transmitter apparatus of claim 7 wherein each proportionality constant $\gamma_i$ is a ratio of a) an average number of nearest neighbors for an $i^{th}$ class of data to b) a product distance for that class.

9. The transmitter apparatus of claim 7 wherein the signal points of said constellation are of equal amplitude.

10. The invention of claim 9 wherein said signal points are nonuniformly spaced in phase.

11. Communications apparatus comprising,
    means for encoding first and second portions of a stream of input data using first and second redundancy codes, respectively, to generate multi-level-coded words each of which has a value and includes at least one data element from each encoded portion, said first code having a minimum Hamming distance that is greater than a minimum Hamming distance of said second code,
    means for selecting signal points of a predetermined signal constellation as a function of the values of said multi-level-coded words,
    means for transmitting a signal representing the selected signal points over a communication channel having multiplicative Rayleigh noise as the predominant noise phenomenon,
    means for receiving said signal from said channel, and
    means for recovering said stream of input data from the received signal,
    said constellation and codes being such that, in the transmission of said signal, a probability of error for said first portion is less than a probability of error for said second portion.

12. The apparatus of claim 11 wherein said first code has a degree of built-in time-diversity which is greater than a degree of built-in time-diversity of said second code.

13. The apparatus of claim 12 wherein said stream of input data represents information and wherein said first and second portions of said stream of input data respectively represent more and less important aspects of said information.

14. The apparatus of claim 13 wherein the signal points of said constellation are of equal amplitude.

15. The invention of claim 14 wherein said signal points are nonuniformly spaced in phase.

16. The apparatus of claim 13 wherein said constellation and said selecting means are such as to modulate said multi-level-coded words using differential phase shift keying.

17. Communications apparatus for communicating a plurality of streams of data over a channel characterized where multiplicative Rayleigh noise is a predominant noise phenomenon, said apparatus comprising
means for encoding said plurality of streams using respective associated redundancy codes to generate multi-level-coded words, each of which having a value,
means for selecting signal points of a predetermined signal constellation as a function of the values of said multi-level-coded words,
means for transmitting a signal representing the selected signal points over said communication channel, said channel being such that, for an $i^{th}$ one of said streams, $$P_e(i) \approx \gamma_i [1/SNR]^{d_{Hi}},$$

where
SNR is a signal-to-noise ratio of said channel,
$d_{Hi}$ is a minimum Hamming distance of the code which encodes said $i^{th}$ stream of data,
$P_e(i)$ is a probability of error, upon decoding, for said $i^{th}$ stream of data, and
$\gamma_i$ is a proportionality constant for said $i^{th}$ stream of data which is a function of said codes and said constellation,
said codes and said constellation being chosen such that the value of $P_e(i)$ decreases for decreasing values of i,
means for receiving said signal from said channel, and
means for recovering said plurality of streams of data from the received signal.

18. The transmitter apparatus of claim 17 wherein the proportionality constant $\gamma_i$ is a ratio of a) an average number of nearest neighbors for an $i^{th}$ class of data to b) a product distance for that class.

19. A method comprising the steps of
encoding first and second portions of a stream of input data using first and second redundancy codes, respectively, to generate multi-level-coded words each of which has a value and includes at least one data element from each encoded portion, said first code having a minimum Hamming distance that is greater than a minimum Hamming distance of said second code,
selecting signal points of a predetermined signal constellation as a function of the values of said multi-level-coded words, and
transmitting a signal representing the selected signal points over a fading communication channel,
said constellation and codes being such that, in the transmission of said signal, a probability of error for said first portion is less than a probability of error for said second portion.

20. The method of claim 19 wherein said stream of input data represents information and wherein said first and second portions of said stream of input data respectively represent more and less important aspects of said information.

21. The method of claim 19 wherein the signal points of said constellation are of equal amplitude.

22. The method of claim 19 wherein said constellation and said selecting means are such as to modulate said multi-level-coded words using differential phase shift keying.

23. The method of claim 19 wherein said first code has a degree of built-in time-diversity which is greater than a degree of built-in time-diversity of said second code.

24. A method for communicating a plurality of streams of data over a channel characterized by Rayleigh fading, said method comprising the steps of
encoding said plurality of streams using respective associated redundancy codes to generate multi-level-coded words, each of which has a value,
selecting signal points of a predetermined signal constellation as a function of the values of said multi-level-coded words,
transmitting a signal representing the selected signal points over said communication channel, said channel being such that, for an $i^{th}$ one of said streams, $$P_e(i) \approx \gamma_i [1/SNR]^{d_{Hi}},$$

where
SNR is a signal-to-noise ratio of said channel,
$d_{Hi}$ is a minimum Hamming distance of the code which encodes said $i^{th}$ stream of data,
$P_e(i)$ is a probability of error, upon decoding, for said $i^{th}$ stream of data, and
$\gamma_i$ is a proportionality constant for said $i^{th}$ stream of data which is a function of said constellation,
said codes and said constellation being chosen such that the value of $P_e(i)$ decreases for decreasing values of i,
receiving said signal from said channel, and
recovering said plurality of streams of data from the received signal.

25. The method of claim 24 wherein each proportionality constant $\gamma_i$ is a ratio of a) an average number of nearest neighbors for an $i^{th}$ class of data to b) a product distance for that class.

26. A method for processing a signal generated by the steps of
encoding first and second portions of a stream of input data using first and second redundancy codes, respectively, to generate multi-level-coded words each of which has a value and includes at least one data element from each encoded portion, said first code having a minimum Hamming distance that is greater than a minimum Hamming distance of said second code,
selecting signal points of a predetermined signal constellation as a function of the values of said multi-level-coded words, and
transmitting a signal representing the selected signal points over a communication channel having multiplicative Rayleigh noise as a predominant noise phenomenon, said constellation and codes being such that, in the transmission of said signal, a probability of error for said first portion is less than a probability of error for said second portion, said method comprising the steps of receiving said signal from said channel, and recovering said stream of input data from the received signal.

27. The method of claim 26 wherein said first code has a degree of built-in time-diversity which is greater than a degree of built-in time-diversity of said second code.

28. The method of claim 27 wherein said stream of input data represents information and wherein said first and second portions of said stream of input data respectively represent more and less important aspects of said information.

29. The method of claim 28 wherein the signal points of said constellation are of equal amplitude.

30. The method of claim 29 wherein said signal points are non-uniformly spaced in phase.

31. The method of claim 28 wherein said constellation and said selecting step are such as to modulate said multi-level-coded words using differential phase shift keying.

* * * * *